(12) United States Patent
Liu et al.

(10) Patent No.: US 12,020,906 B2
(45) Date of Patent: *Jun. 25, 2024

(54) GROUNDING CAP MODULE AND GAS INJECTION DEVICE

(71) Applicant: Taiwan Semiconductor Manufacturing Company, Ltd., Hsinchu (TW)

(72) Inventors: Li-Shi Liu, Taipei (TW); Shih-Tsung Chen, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/079,903

(22) Filed: Dec. 13, 2022

(65) Prior Publication Data

US 2023/0110291 A1   Apr. 13, 2023

Related U.S. Application Data

(60) Division of application No. 17/015,089, filed on Sep. 9, 2020, now Pat. No. 11,551,911, which is a continuation of application No. 15/874,885, filed on Jan. 19, 2018, now Pat. No. 10,818,479.

(60) Provisional application No. 62/584,903, filed on Nov. 12, 2017.

(51) Int. Cl.
H01J 37/32 (2006.01)
G03F 1/22 (2012.01)
H01L 21/67 (2006.01)

(52) U.S. Cl.
CPC ............ *H01J 37/3244* (2013.01); *G03F 1/22* (2013.01); *H01J 37/32541* (2013.01); *H01L 21/67069* (2013.01); *H01L 21/6719* (2013.01); *H01J 2237/334* (2013.01)

(58) Field of Classification Search
CPC ............ H01J 37/3244; H01J 37/32541; H01J 2237/334; H01J 37/32009; H01J 37/32018; H01J 37/32027; H01J 37/32036; H01J 37/32082; H01J 37/32091; G03F 1/22; H01L 21/67069; H01L 21/6719; C23C 16/50; C23C 16/503; C23C 16/505;
(Continued)

(56) References Cited

U.S. PATENT DOCUMENTS 6,042,650 A * 3/2000 Uesugi .................... C23C 16/52
  118/712
6,503,364 B1 * 1/2003 Masuda ............ H01J 37/32009
  118/712
(Continued)

*Primary Examiner* — Rudy Zervigon
(74) *Attorney, Agent, or Firm* — JCIPRNET

(57) ABSTRACT

A grounding cap module includes a main body, a frame portion, and a cap portion. The main body includes a first opening penetrating the main body and a grounding portion disposed on a periphery of the main body and configured to be electrically grounded. The frame portion is disposed on the main body and includes a second opening aligned with the first opening. The cap portion is disposed on the frame portion and covers the second opening, wherein the first opening, the second opening and the cap portion define a receiving cavity. A gas injection device and an etching apparatus using the same are also provided.

20 Claims, 6 Drawing Sheets

(58) Field of Classification Search
CPC ... C23C 16/507; C23C 16/509; C23C 16/513; C23C 16/517
USPC .................. 118/715; 156/345.33, 345.34
See application file for complete search history.

(56) References Cited

U.S. PATENT DOCUMENTS

| | | | | |
|---|---|---|---|---|
| 8,070,910 | B2* | 12/2011 | Matsumoto | ....... C23C 16/45565 156/345.34 |
| 2003/0070620 | A1* | 4/2003 | Cooperberg | ........ H01J 37/3244 118/723 AN |
| 2008/0083883 | A1* | 4/2008 | Bogart | .................. C23C 16/513 250/423 P |

* cited by examiner

GROUNDING CAP MODULE AND GAS INJECTION DEVICE

CROSS-REFERENCE TO RELATED APPLICATION

This is a continuation application of and claims the priority benefit of a prior application Ser. No. 17/015,089, filed on Sep. 9, 2020. The prior application Ser. No. 17/015,089 is a continuation application and claims the priority benefit of a prior application Ser. No. 15/874,885, filed on Jan. 19, 2018, U.S. Pat. No. 10,818,479, issued on Oct. 27, 2020. The prior application Ser. No. 15/874,885 claims the priority benefit of U.S. provisional application Ser. No. 62/584,903, filed on Nov. 12, 2017. The entirety of the above-mentioned patent application is hereby incorporated by reference herein and made a part of this specification.

BACKGROUND

A photomask is used during the manufacture of an integrated circuit (IC) to transfer the design of each chip layer onto a semiconductor substrate. Since a photomask contains the pattern for a single layer of the chip, a set of 15 to 30 photomasks is typically used in the construction of a chip. Photomasks are reusable and typically comprise a substrate, a reflective layer, and an absorber layer.

Extreme ultraviolet (EUV) lithography is a promising new patterning technology for producing very small (i.e. 14 nm) chips. EUV lithography, like optical lithography, uses a set of photomasks that reflect EUV light to form a patterned photoresist on a semiconductor substrate.

Photomasks for EUV lithography are generally manufactured by etching the chip layer pattern into the photomask. This process has a low tolerance for error, since any defects in the photomask will be transferred to the semiconductor substrate during EUV lithography. To manufacture a photomask, a substrate (e.g., quartz) is typically etched in an etching chamber wherein a photomask can be exposed to various process gasses and plasmas.

Dry etching processes, also referred to as plasma etching processes, are carried out to etch various films at various stages of the semiconductor manufacturing operation and produce various device features. Multiple plasma etching operations are generally required to form a semiconductor device. One shortcoming of such plasma etching operations is the generation of polymers as etch by-products within the etching chamber. The polymers can adhere to various surfaces within the etch chamber and become dislodged, contaminating the chamber.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
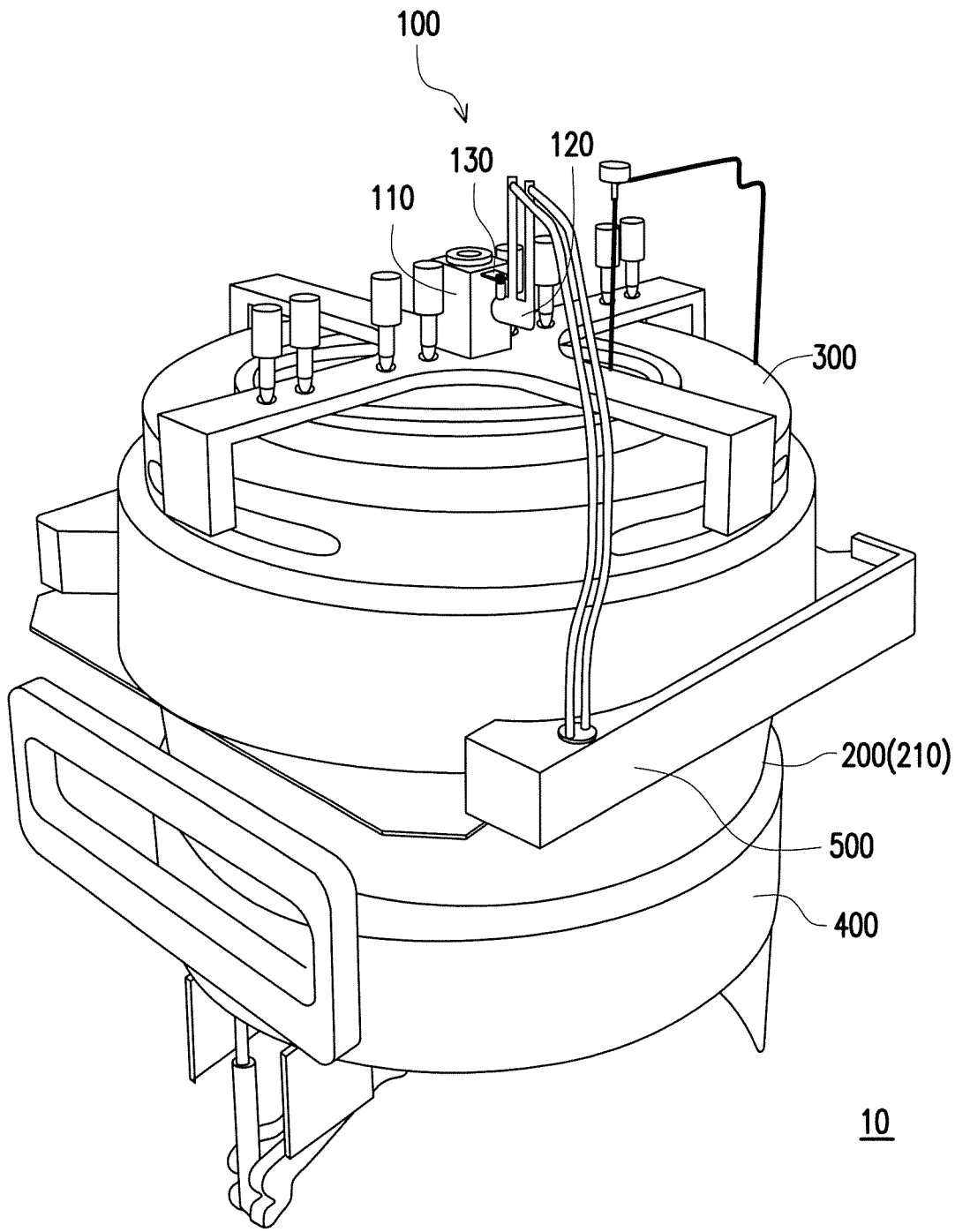
FIG. 1 illustrates a schematic view of an etching apparatus according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Figure 2:
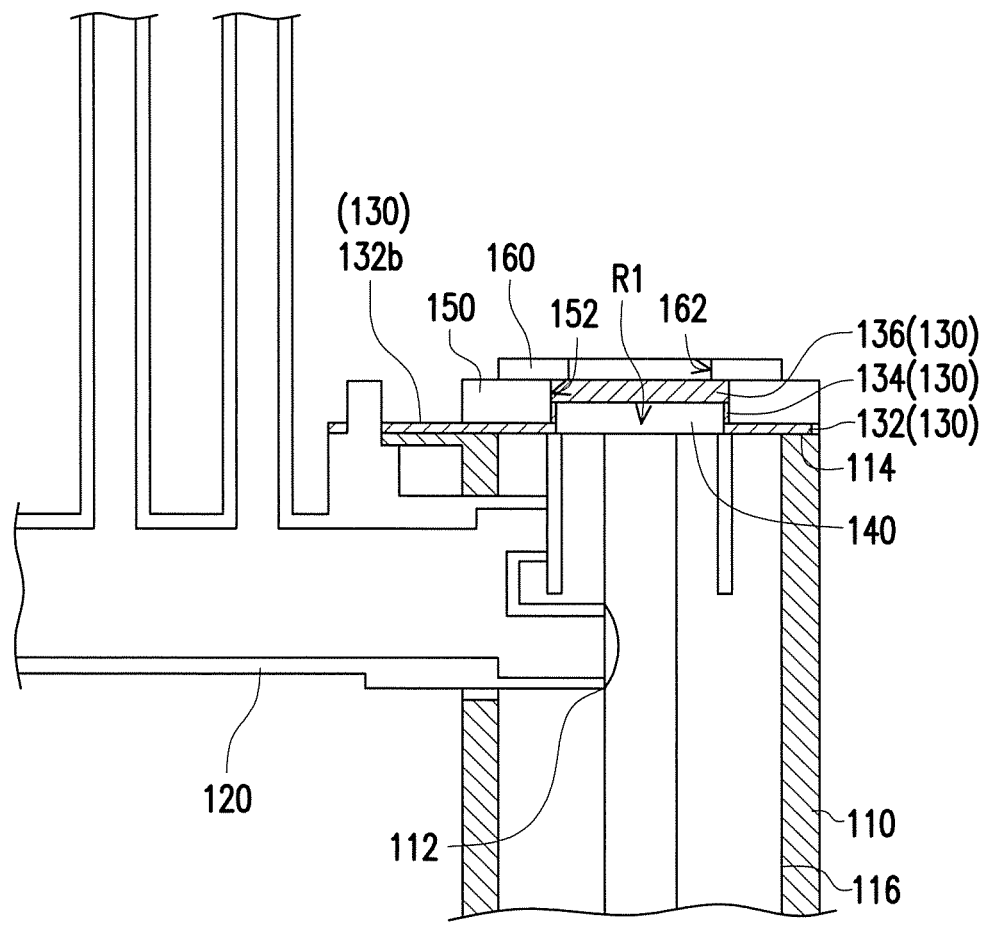
FIG. 2 illustrates a cross sectional view of a gas injection device according to some exemplary embodiments of the present disclosure.

FIG. 1 illustrates a schematic view of an etching apparatus according to some exemplary embodiments of the present disclosure. FIG. 2 illustrates a cross sectional view of a gas injection device according to some exemplary embodiments of the present disclosure. Referring to FIG. 1 and FIG. 2, in some embodiments, the etching apparatus 10 may be a plasma etching apparatus (also referred to as dry etching apparatus) used in the production of semiconductor components such as, but not limited to, semiconductor wafers. In some embodiments, the etching apparatus 10 includes an etching chamber 200 defining a chamber cavity 210 and a gas injection device 100 configured to supply process gas, e.g. oxygen or a fluorine-bearing gas, into the etching chamber 200. Accordingly, the etching apparatus 10 is configured to produce a plasma from the process gas using a high frequency electric field. In detail, a semiconductor wafer may be placed in the etching chamber 200, and the air is evacuated from the etching chamber 200 using, for example, a system of vacuum pumps. Then, the process gas is introduced at low pressure, and is excited into a plasma through dielectric breakdown. In some embodiments, plasma etching processes, also referred to as dry etching processes, are carried out to etch various films at various stages of the semiconductor manufacturing operation and produce various device features. Multiple plasma etching operations are generally required to form a semiconductor device.

The etching apparatus 10 in the disclosure applies to various semiconductor wafer sizes and various semiconductor wafer materials upon which semiconductor devices are formed. Silicon and gallium arsenide are examples of semiconductor wafer materials commonly used in today's semiconductor manufacturing industry. The grounding cap module 130 and the gas injection device 100 of the disclosure applies to various etching apparatus manufactured by various equipment manufacturers. The etching apparatus 10 in the disclosure may be used in various types of dry etching operations used to etch various films at various stages in the semiconductor device manufacturing processing sequence.

In some embodiments, the etching apparatus 10 may further include a top electrode 300 and a bottom electrode 400. The top electrode 300 is disposed on the upper portion of the etching chamber 200, and the process gas provided by the gas injection device 100 is introduced to the chamber cavity 210 through the top electrode 300. In some embodiments, the top electrode 300 may include a plurality of gas holes passing through the top electrode 300 for the process gas to pass thereby. The bottom electrode 400 is disposed on the lower portion of the etching chamber 200. The top electrode 300 and the bottom electrode 400 operate to incur a capacitive effect in the etching chamber 200. Herein, the process gas introduced to the etching chamber 200 is subject to an electrochemical reaction and thereby ionized, transforming into plasma. Thereby, the semiconductor wafer placed in the etching chamber 200 is etched by the plasma and the portions without photoresist are removed thereby. Then, the plasma and corroded substances may be expelled to the exterior of the etching chamber 200 by an exhaust pump.

In some embodiments, the gas injection device 100 includes a main conduit 110, a gas pipe 120 and a grounding cap module 130. The main conduit 110 is connected to the etching chamber 200 and includes a gas inlet 112. The gas pipe 120 is connected to the gas inlet 112 of the main conduit 110 to inject process gas into the main conduit 110. In other words, the main conduit 110 is in fluid communication with the gas pipe 120 through the gas inlet 112. In one of the implementations, the gas injection device 100 may include multiple gas pipes 120 respective connected to different gas sources. Accordingly, the process gas injected into the main conduit 110 is a gas mixture, which includes, for example, an inert carrier gas, anhydrous reactive gas, and enabling chemical gas of an enabling chemical compound, etc.

In some embodiments, a source of the anhydrous reactive gas can be selected from reactive gas capable of providing a steady flow of anhydrous halogen-containing gas, such as gaseous hydrogen fluoride, and hydrazine, ammonia, carbon dioxide and oxides of nitrogen, etc. The hydrogen fluoride source may be supplied as a liquid in a cylinder, and then evaporated at a temperature sufficient to ensure free flow of the gaseous hydrogen fluoride from the source. In general, the source of hydrogen fluoride is maintained at a suitable temperature ensuring that the hydrogen fluoride is maintained in an anhydrous state.

In some embodiments, the inert carrier gas used in the etching apparatus 10 may be any gas which is inert to the materials to be treated and which will remain in the gaseous phase under the process conditions present. Suitable gases include the noble gases, such as nitrogen, argon, neon, argon, helium, krypton and xenon, etc. The inert carrier gas is used both in purging the gas injection device 100 and the etching chamber 200 before and after the reaction procedure. A source of the enabling chemical gas of an enabling chemical compound may include, for example, water vapor generation. The water source should be of high purity, for example, deionized water. In addition to enabling chemicals such as water, and alcohols such as methanol, ethanol and isopropanol, other enabling chemicals may be used. The disclosure is not limited thereto.

Accordingly, the mixed process gases are flowed into the etching chamber 200 as to expose the film on the wafer to the diluted reactive gas, and the small quantities of water vapor causes the reaction between the oxide film and the anhydrous reactive gas to be initiated and sustained through duration of the etching process. The semiconductor wafer materials which can be treated by the etching process can, generally, be any type of semiconductor material which will be unaffected by the halogen-containing gaseous etchant medium. When the semiconductor material is a wafer to be processed in the manufacture of integrated circuit chips, it will typically be composed of such materials as silicon, polysilicon, garnet, binaries such as gallium arsenide and indium phosphide, also ternaries such as CdHgTe, GaAlAs and GaInP, and quaternaries such as GaInAsP. Other substrate materials which may be treated by this etching, cleaning, and/or polishing process include stainless steel, quartz, aluminum, germanium, gallium and selenium.

In general, polymers as etch by-products can adhere to various surfaces within the etching chamber 200 and become dislodged, contaminating the etching chamber 200. Accordingly, in some embodiments, the gas pipe 120 is electrically grounded so as to reduce the generation of polymers as etch by-products within the gas injection device 100 and the etching chamber 200. In one of the implementations, the gas pipe 120 is connected to a ground electrode 500 shown in FIG. 1. In some embodiments, the main conduit 110 may include a shielding layer 116 disposed on an inner wall of the main conduit 110 to reduce polymer residue in the main conduit 110. In some circumstances, polymer residues may still accumulate on an upper portion of the main conduit 110, which is located above the gas inlet 114. Such polymer residues may fall off from the top surface 114 and fall on devices being fabricated on the semiconductor wafer, leading to a high number of defects in the devices.

Accordingly, in some embodiments, the grounding cap module 130 is disposed on the top surface 114 of the main conduit 110, which is located above the gas inlet 114. The grounding cap module 130 covers the top surface 114 and includes a grounding portion 132b, which is connected to the gas pipe 120 to be electrically grounded. In some embodiments, the grounding portion 132b may be fixed to the gas pipe 120 by, for example, a screw, or any other suitable fasten means. In addition, the material of the grounding cap module 130 includes metal, such as silver, nickel, or other suitable metal material. With the configuration of the grounding cap module 130, the issue of polymer residue accumulating on the top surface 114 of the main conduit 110 can be resolved, and yield rates of the devices being fabricated on the semiconductor wafer can be improved.

In some embodiments, the gas injection device 100 may further include an optical window 140 for operators to look therethrough. The optical window 140 is disposed on the top surface 114 of the main conduit 110. The optical window 140 is protruded from the top surface 114 of the main conduit 110 and is made of, for example, sapphire. In other words, the optical window 140 may be, but not limited thereto, a sapphire window. Accordingly, the grounding cap module 130 may include a receiving cavity R1 for receiving and covering the optical window 140.

Figure 3:
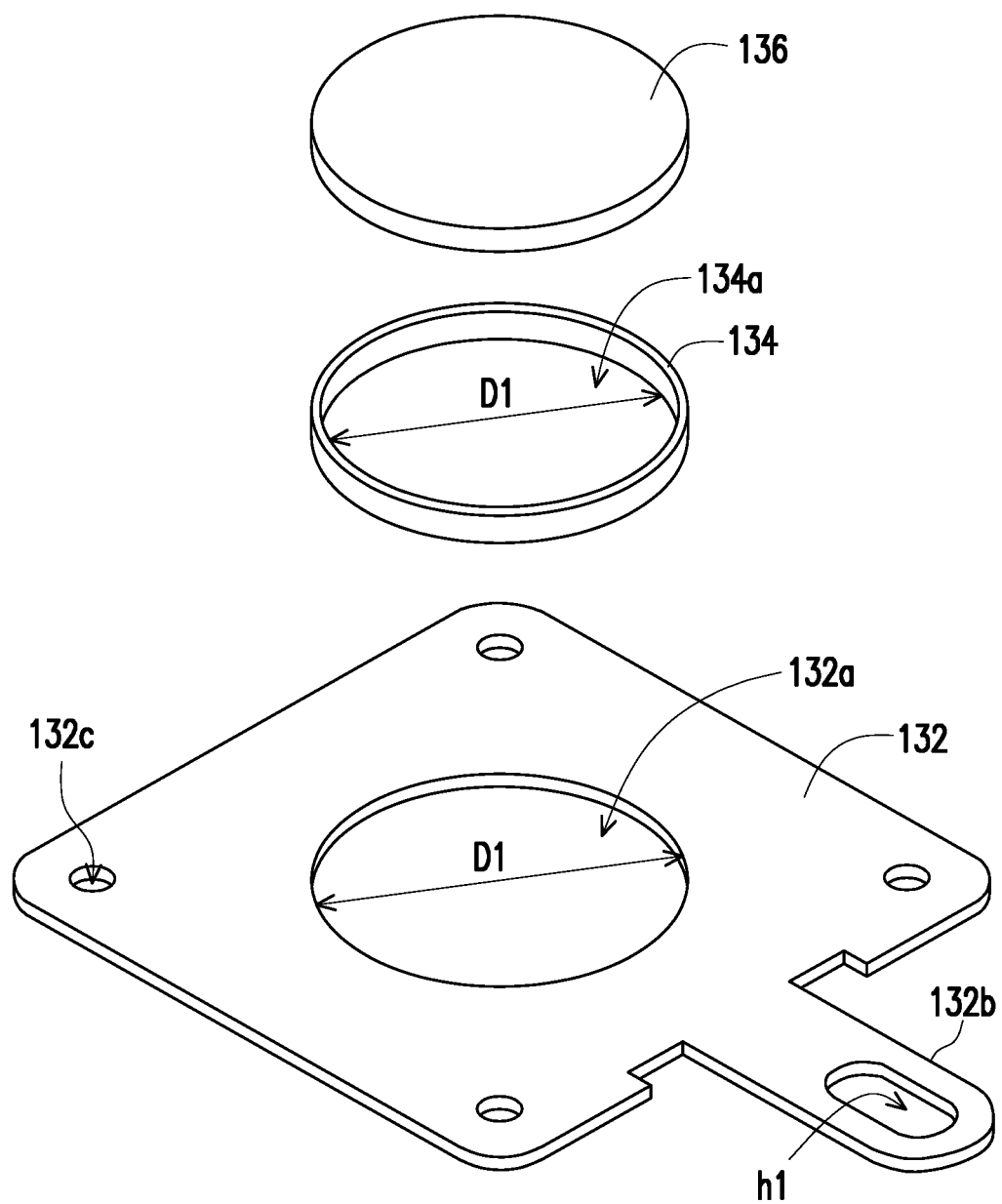
FIG. 3 illustrates an exploded view of a grounding cap module according to some exemplary embodiments of the present disclosure.
Figure 4:
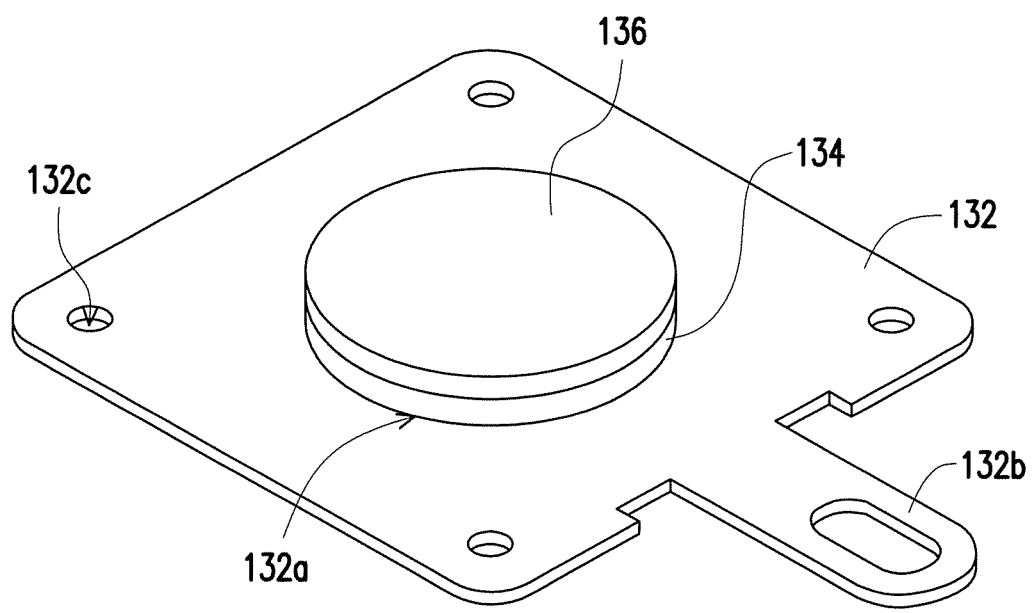
FIG. 4 illustrates a schematic view of a grounding cap module according to some exemplary embodiments of the present disclosure.

FIG. 3 illustrates an exploded view of a grounding cap module according to some exemplary embodiments of the present disclosure. FIG. 4 illustrates a schematic view of a grounding cap module according to some exemplary embodiments of the present disclosure. Referring to FIG. 3 and FIG. 4, in some embodiments, the grounding cap module 130 may include a main body 132, a frame portion 134, and a cap portion 136. The main body 132 include a first opening 132a and the grounding portion 132b as shown in FIG. 3. The first opening 132a penetrates the main body 132, and the grounding portion 132b is disposed on a periphery of the main body 132. In other words, the grounding portion 132b is protruded from an outer edge of the main body 110 and connected to the ground electrode 500 through the gas pipe 120, such that grounding cap module 130 is electrically grounded by the grounding portion 132b. In some embodiments, the grounding portion 132b may have a fastening hole h1 for a fastening means, such as a screw, to penetrate therethrough, so as to lock the grounding portion 132b to the gas pipe 120.

In some embodiments, the frame portion 134 is disposed on the main body 132 and includes a second opening 134a as shown in FIG. 3. The second opening 134a is aligned with the first opening 132a. In the present embodiments, the frame portion 134 may surround and stand on the part of the main body 132 around the first openings 132a, and the side wall of the second opening 134a is coplanar with the side wall of the first opening 132a. In one of the implementations, the first opening 132a and the second opening 134a may both be in circular shapes with the same diameters. In such embodiments, the frame portion 134 may be in a ring shape, but the disclosure is not limited thereto.

In some embodiments, the dimensions of the first opening 132a and the second opening 134a may be identical. In other embodiments, the depth (height) of first opening 132a may be different from the depth (height) of the second opening 134a. In other embodiments, the diameter of the first opening 132a may also be different from the diameter of the second opening 134a. In such embodiments, the side wall of the second opening 134a may not be coplanar with the side wall of the first opening 132a. It is noted that the shapes and the dimensions of the first opening 132a and the second opening 134a may be adjusted according to the shapes and the dimensions of the optical window 140, such that the optical window 140 can be fitted therein.

In some embodiments, the cap portion 136 is disposed on the frame portion 134 and covers the second opening 134a. With such configuration, the first opening 132a, the second opening 134a, and the cap portion 136 can jointly define the receiving cavity R1, as shown in FIG. 2, for receiving and covering the optical window 140. With such configuration, the grounding cap module 130 can be applied to the gas injection device 120 to meet the grounding requirement without altering the original structure of the gas injection device 120. Therefore, the issue of polymer residue accumulating on the top surface 114 of the main conduit 110 can be resolved without altering the original configuration of the gas injection device 120, and yield rates of the devices being fabricated on the semiconductor wafer can be improved.

In addition, the materials of the main body 132, the frame portion 134, and the cap portion 136 may include metal. In some embodiments, the materials of the main body 132, the frame portion 134, and the cap portion 136 may be the same and may include, but not limited thereto, silver, nickel, or any other suitable metal or alloy. In the present embodiments, the grounding cap module 130 is made in a plurality of separate pieces (e.g. the main body 132, the frame portion 134, and the cap portion 136) for simplicity of manufacture of the grounding cap module 130. Moreover, the production cost of the grounding cap module 130 can be effectively reduced. Certainly, the disclosure is not limited thereto. Alternatively, in other embodiments, the grounding cap module can be integrally formed. In other words, the grounding cap module can be made in one piece with the grounding portion 132b extended to the gas pipe 120 to be electrically grounded, and the one-pieced grounding cap module may have the receiving cavity R1 for receiving the optical window 140.

Figure 5:
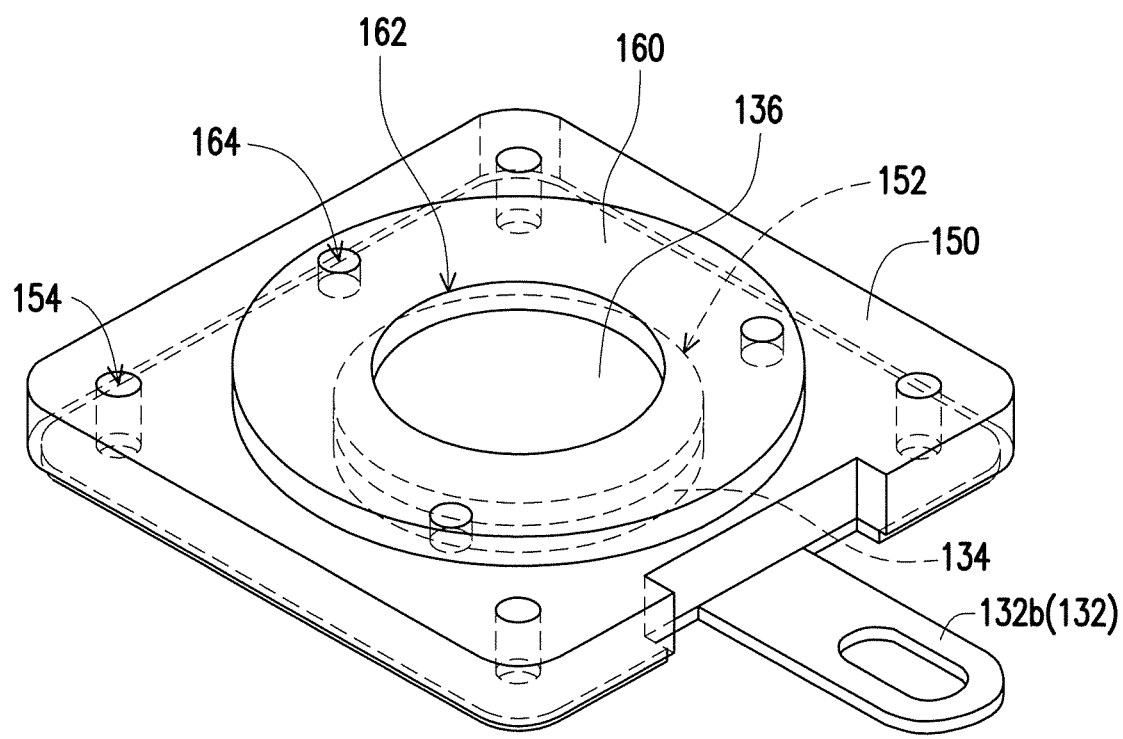
FIG. 5 illustrates a perspective view of a part of the components of the gas injection device according to some exemplary embodiments of the present disclosure.
Figure 6:
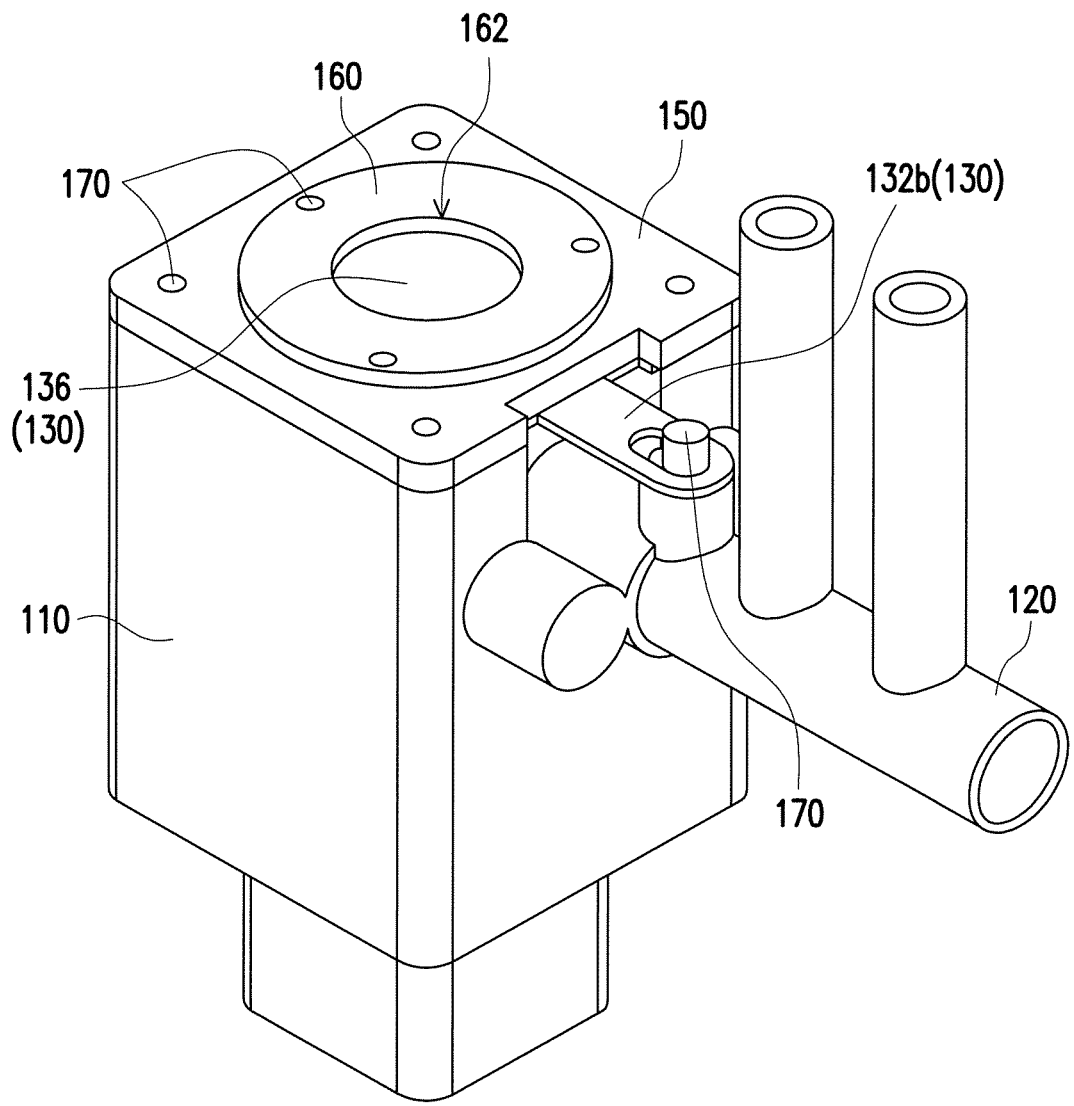
FIG. 6 illustrates a schematic view of a part of the components of the gas injection device according to some exemplary embodiments of the present disclosure.

FIG. 5 illustrates a perspective view of a part of the components of the gas injection device according to some exemplary embodiments of the present disclosure. FIG. 6 illustrates a schematic view of a part of the components of the gas injection device according to some exemplary embodiments of the present disclosure. Referring to FIG. 5 and FIG. 6, in some embodiments, the gas injection device 100 may further include a cover plate 150, which is disposed on the main body 132 of the grounding cap module 130. The cover plate 150 includes a through hole 152 as shown in FIG. 5. The cap portion 136 and the frame portion 134 are fitted in the through hole 152 as shown in FIG. 2 and FIG. 5. In some embodiments, originally, the through hole 152 of the cover plate 150 is configured to receive the optical window 140, but, now that the optical window 140 is received by the grounding cap module 130, the through hole 152 is configured to receive the grounding cap module 130 and the optical window 140 therein as shown in FIG. 2.

In some embodiments, the cover plate 150 may be fixed to the top surface of the main conduit 110 by a plurality of fastening components 170 such as, but not limited to, screws. In the present embodiment, the cover plate 150 may include a plurality of fastening holes 154 as shown in FIG. 5. Correspondingly, the main body 132 may include a plurality of fastening holes 132c as shown in FIG. 4. The fastening holes 154 of the cover plate 150 are aligned with the fastening holes 132c of the main body 130 respectively. With such configuration, the fastening components 170 penetrate the fastening holes 154 of the cover plate 150 and the fastening holes 132c of the main body 132 and then are fastened to the top surface of the main conduit 110 as shown in FIG. 6. Thereby, the main body 132 can be fixed onto the top surface of the main conduit 110 by using the cover plate 150 of the gas injection device 100 and the same fastening components 170 for fixing the cover plate 150, without using any additional fasten means.

In some embodiments, the gas injection device 100 may further include a cover lid 160 disposed on the cover plate 150. The cover lid 160 covers at least a part of the cap portion 136 of the grounding cap module 130 as shown in FIG. 5 for fixing the cap portion 136 and the frame portion 134 in the through hole 152. In one of the implementations, the cover lid 160 may include a plurality of fastening holes 164. Correspondingly, the cover plate 150 may also include a plurality of fastening holes aligned with the fastening holes 164 respectively. With such configuration, the fastening components 170 penetrate the fastening holes 164 of the cover lid 160 and the corresponding fastening holes of the cover plate to fasten the cover lid 160 onto the cover plate as shown in FIG. 6. Thereby, with the cover lid 160 at least partially covering the cap portion 136 of the grounding cap module 130, the cap portion 136 and the frame portion 134 can be fixed in the through hole 152 without using any additional fasten means. Moreover, the cap portion 136 can be simply placed on the frame portion 134 without any adhesive or fasten means disposed therebetween, and the positions of the cap portion 136 and the frame portion 134 can be fixed in the through hole 152 by simply fastening the cover lid 160 onto the cover plate 150. Therefore, the assembling process and the components of the grounding cap module 130 can be simplified.

In some embodiments, the cover lid 160 may include a window opening 162, which exposes a part of the cap portion 136. In some embodiments, originally, the window opening 162 of the cover lid 160 is configured to expose the optical window 140, and, now that the optical window 140 is covered by the cap portion 136, the window opening 162 is configured to expose a part of the cap portion 136 as shown in FIG. 6. In the present embodiment, the size of the window opening 162 is substantially smaller than the size of the cap portion 136. In the embodiments of the shapes of the window opening 162 and the cap portion 136 being circular, the diameter of the window opening 162 is substantially smaller than the diameter of the cap portion 136. Thereby, the cover lid 160 can still partially cover the cap portion 136 to keep the cap portion 136 and the frame portion 134 in the through hole 152 without using any additional fasten means.

As such, the grounding cap module 130 in the disclosure can resolve the issue of polymer residue accumulating on the top surface 114 of the main conduit 110 without altering the original configuration of the gas injection device 100 and using any additional fasten means. Therefore, yield rates of the etching process performed by the etching apparatus 10 can be improved and the assembling process and the components of the grounding cap module 130 are also simplified.

In accordance with some embodiments of the disclosure, a grounding cap module includes a main body, a frame portion, and a cap portion. The main body includes a first opening penetrating the main body and a grounding portion disposed on a periphery of the main body and configured to be electrically grounded. The frame portion is disposed on the main body and includes a second opening aligned with the first opening. The cap portion is disposed on the frame portion and covers the second opening, wherein the first opening, the second opening and the cap portion define a receiving cavity.

In accordance with some embodiments of the disclosure, a gas injection device includes a main conduit, a gas pipe, an optical window, and a grounding cap module. The main conduit includes a gas inlet. The gas pipe is connected to the gas inlet to inject process gas into the main conduit, wherein the gas pipe are electrically grounded. The optical window is disposed on a top surface of the main conduit, wherein the top surface is located above the gas inlet. The grounding cap module is disposed on the top surface and includes a receiving cavity for receiving and covering the optical window and a grounding portion connected to the gas pipe to be electrically grounded.

In accordance with some embodiments of the disclosure, an etching apparatus includes an etching chamber and a gas injection device. The etching chamber defines a chamber cavity. The gas injection device includes a main conduit, a gas pipe, an optical window, and a grounding cap module. The main conduit is connected to the etching chamber. The gas pipe is connected to the main conduit to inject process gas therein, wherein the gas pipe is electrically grounded. The grounding cap module is disposed on a top surface of the main conduit and includes a grounding portion connected to the gas pipe to be electrically grounded.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A grounding cap module for an etching apparatus, comprising:
    a main body disposed over a main conduit of the etching apparatus and comprising a first opening penetrating the main body and a grounding portion disposed on a periphery of the main body and configured to be electrically grounded;
    a frame portion disposed on the main body and having a second opening aligned with the first opening; and
    a cap portion disposed on the frame portion and covers the second opening, wherein the first opening, the second opening and the cap portion define a receiving cavity for receiving and covering an optical window disposed on a top surface of the main conduit.

2. The grounding cap module as claimed in claim 1, wherein materials of the main body, the frame portion, and the cap portion comprise metal, and the main body, the frame portion, and the cap portion are electrically connected to a ground electrode through the grounding portion.

3. The grounding cap module as claimed in claim 1, wherein the first opening and the second opening are in circular shapes with the same diameters.

4. The grounding cap module as claimed in claim 1, wherein the frame portion is in a ring shape.

5. The grounding cap module as claimed in claim 1, wherein the grounding portion is protruded from an outer edge of the main body and is connected to a ground electrode.

6. The grounding cap module as claimed in claim 1, wherein the grounding portion is connected to a gas pipe of the etching apparatus to be electrically grounded through the gas pipe.

7. The grounding cap module as claimed in claim 6, wherein the grounding portion is fixed to the gas pipe by a fasten component.

8. A grounding cap module for an etching apparatus, comprising:
    a main body disposed on a top surface of a main conduit of the etching apparatus and surrounding a periphery of the top surface of the main conduit, wherein the main body comprises a grounding portion protruded from an outer rim of the main body and configured to be electrically grounded and a first opening penetrating the main body, wherein the grounding portion is disposed above the top surface of the main conduit;

a lid disposed on the main body and covering the top surface of the main conduit, wherein the lid comprises a frame portion disposed on the main body and comprising a second opening aligned with the first opening, and a cap portion disposed on the frame portion and covers the second opening, wherein the first opening, the second opening and the cap portion define a receiving cavity.

9. The grounding cap module as claimed in claim 8, wherein the frame portion surrounds and stands on a part of the main body around the first openings.

10. The grounding cap module as claimed in claim 8, wherein the etching apparatus further comprises an optical window disposed over the main conduit, and the grounding cap module is disposed on and covers the optical window.

11. The grounding cap module as claimed in claim 10, wherein the receiving cavity receives and covers the optical window.

12. The grounding cap module as claimed in claim 8, wherein the grounding portion is connected to a gas pipe of the etching apparatus to be electrically grounded through the gas pipe.

13. The grounding cap module as claimed in claim 12, wherein the grounding portion further comprises a fastening hole for a fasten component to penetrate therethrough and lock the grounding portion to the gas pipe.

14. The grounding cap module as claimed in claim 8, wherein material of the main body and the lid comprises metal.

15. A gas injection device for an etching apparatus, comprising:
  a main conduit;
  an optical window disposed over a top surface of the main conduit; and
  a grounding cap module comprising:
    a main body disposed on the top surface of the main conduit and surrounding a periphery of the top surface of the main conduit, wherein the main body comprises a first opening penetrating the main body and a grounding portion protruded from an outer rim of the main body and configured to be electrically grounded; and
    a lid disposed on the main body and covering the top surface of the main conduit, wherein the lid comprises a frame portion disposed on the main body and comprising a second opening aligned with the first opening, and a cap portion disposed on the frame portion and covers the second opening, wherein the first opening, the second opening and the cap portion define a receiving cavity for receiving the optical window.

16. The gas injection device as claimed in claim 15, further comprising:
  a gas pipe connected to the main conduit to inject process gas into the main conduit, wherein the gas pipe is electrically connected to a ground electrode, wherein the grounding portion is connected to the gas pipe.

17. The gas injection device as claimed in claim 15, further comprising:
  a cover plate disposed over the main conduit and comprising a through hole, wherein the lid is fitted in the through hole.

18. The gas injection device as claimed in claim 17, wherein the cover plate is fixed to the main conduit through a fastening component penetrating through a first fastening hole of the cover plate and a second fastening hole and fastened into the main conduit.

19. The gas injection device as claimed in claim 17, further comprising a cover lid disposed on the cover plate and covering at least a part of the cap portion for fixing the cap portion and the frame portion in the through hole of the cover plate.

20. The gas injection device as claimed in claim 19, wherein a plurality of fastening components are configured to penetrate the cover lid and the cover plate to fasten the cover lid onto the cover plate for fixing the grounding cap module to the main conduit.

\* \* \* \* \*